(12) United States Patent
Chen et al.

(10) Patent No.: US 11,875,973 B2
(45) Date of Patent: Jan. 16, 2024

(54) METHODS FOR PREPARING VOID-FREE COATINGS FOR PLASMA TREATMENT COMPONENTS

(71) Applicant: Taiwan Semiconductor Manufacturing Company, Hsinchu (TW)

(72) Inventors: Shih-Tsung Chen, New Taipei (TW); Tsung-Cheng Ho, Hsinchu (TW); Chien-Yu Wang, Hsinchu (TW); Yen-Shih Wang, Tainan (TW); Jiun-Rong Pai, Jhubei (TW); Yeh-Chieh Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/666,969

(22) Filed: Feb. 8, 2022

(65) Prior Publication Data

US 2023/0025296 A1    Jan. 26, 2023

Related U.S. Application Data

(60) Provisional application No. 63/222,490, filed on Jul. 16, 2021.

(51) Int. Cl.
| | |
|---|---|
| *C23C 14/58* | (2006.01) |
| *H01J 37/32* | (2006.01) |
| *C23C 14/24* | (2006.01) |
| *C23C 14/34* | (2006.01) |
| *C23C 14/08* | (2006.01) |
| *C23C 14/06* | (2006.01) |
| *C23C 14/02* | (2006.01) |

(52) U.S. Cl.
CPC ...... *H01J 37/32477* (2013.01); *C23C 14/024* (2013.01); *C23C 14/0694* (2013.01); *C23C 14/083* (2013.01); *C23C 14/24* (2013.01); *C23C 14/34* (2013.01); *C23C 14/5886* (2013.01); *H01J 37/32082* (2013.01); *H01J 37/32568* (2013.01)

(58) Field of Classification Search
CPC . C23C 14/024; C23C 14/0694; C23C 14/083; C23C 14/24; C23C 14/34; C23C 14/5886
See application file for complete search history.

(56) References Cited

U.S. PATENT DOCUMENTS

| | | | |
|---|---|---|---|
| 2013/0098554 A1* | 4/2013 | Chhatre | H01J 37/32119 156/345.33 |
| 2015/0021324 A1* | 1/2015 | Sun | C23C 14/0052 239/589 |
| 2020/0248316 A1* | 8/2020 | Jang | H01L 21/285 |

* cited by examiner

*Primary Examiner* — Shamim Ahmed
*Assistant Examiner* — Bradford M Gates
(74) *Attorney, Agent, or Firm* — Lippes Mathias LLP

(57) ABSTRACT

Methods for preparing a void-free protective coating are disclosed herein. The void-free protective coating is used on a dielectric window having a central hole, which is used in a plasma treatment tool. A first protective coating layer is applied to the window, leaving an uncoated annular retreat area around the central hole. The first protective coating layer is polished to produce a flat surface and fill in any voids on the window. A second protective coating layer is then applied upon the flat surface of the first protective coating layer to obtain the void-free coating. This increases process uptime and service lifetime of the dielectric window and the plasma treatment tool.

20 Claims, 9 Drawing Sheets

METHODS FOR PREPARING VOID-FREE COATINGS FOR PLASMA TREATMENT COMPONENTS

PRIORITY CLAIM AND CROSS-REFERENCE

This application claims priority to U.S. Provisional Patent Application Ser. No. 63/222,490, filed on Jul. 16, 2021, which is incorporated by reference in its entirety.

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device. Plasma treatment is used for various applications in the integrated circuit production process, such as cleaning the wafer or for etching.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
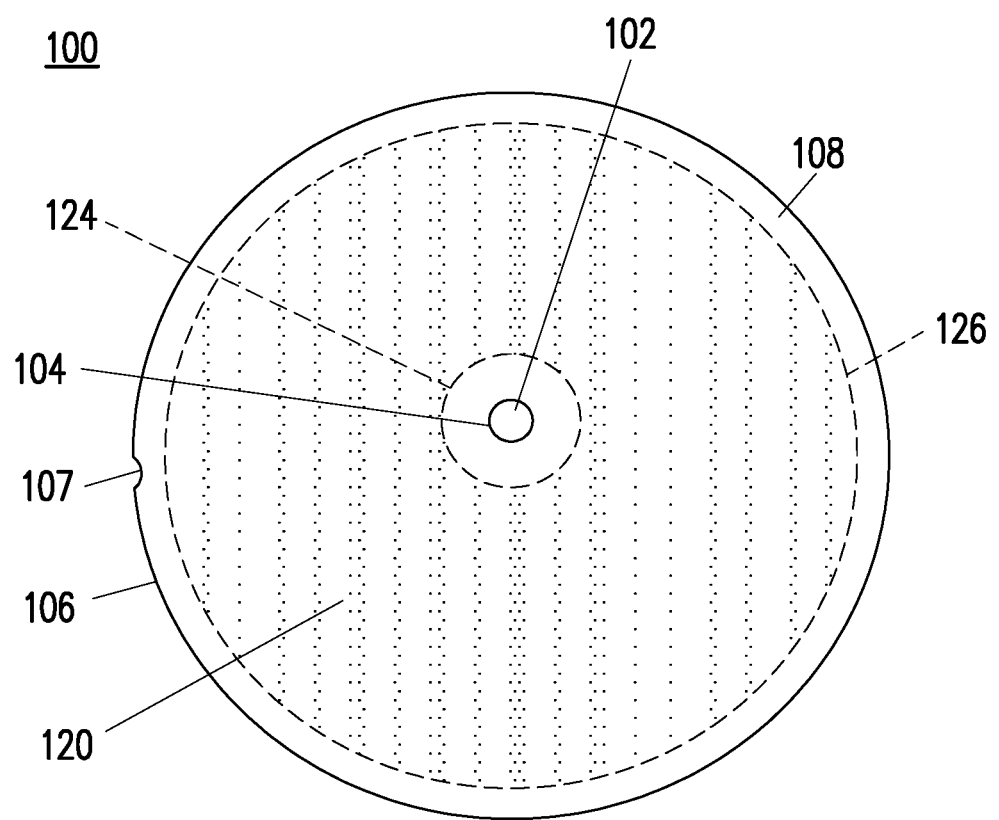
FIG. 1 is a perspective view of a first embodiment of a dielectric window, in accordance with some embodiments of the present disclosure. The dielectric window is in the form of a plate or disk.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure relates to methods for improving plasma treatment tools commonly used in integrated circuit fabrication processes. Such plasma treatment tools are used in applications such as cleaning of wafer substrates; etching processes; and wafer bonding processes such as fusion bonding. Very generally, plasma is produced by applying a radiofrequency (RF) electromagnetic field through a gas between two electrodes. The RF field ionizes the gas molecules and strips them of their electrons, creating a plasma. The ions bombard the wafer substrate, resulting in the desired functions. In certain etchers that use inductively coupled plasma (ICP) or transformer-coupled plasma (TCP), the electrode(s) is separated from the plasma by a dielectric window. The dielectric window serves a protective function, and can also be used to increase plasma uniformity over the wafer substrate. It is noted the window does not need to be visually transparent.

A protective coating is usually applied to the dielectric window. However, stress can be concentrated in particular locations in the coating. Extended exposure to the plasma can result in cracking and/or peeling of the protective coating. The methods of the present disclosure reduce stress concentration in the protective coating. This reduced stress, in turn, increases the service lifetime of the dielectric window and thus increases process uptime (or decreases downtime) of the plasma treatment tool. Wafer quality is also increased, due to reduced particulates produced from a damaged protective coating and the resulting defects when such particulates land on the wafer. This can be measured by improved results in wafer acceptance tests (WAT) and in circuit probing (CP) tests.

FIG. 1 is a perspective view of a dielectric window of the present disclosure, in accordance with some embodiments of the present disclosure. The dielectric window 100 is in the form of a plate or disk having a circular shape, with a central hole 102 therein. For reference, the central hole is used to permit the passage of various pipes, cables, and the like into the reaction chamber, for example to introduce gases therein or for various sensors or other components. The dielectric window includes an inner perimeter 104 at the central hole and an outer perimeter 106. If desired, a notch 107 may be present along the outer perimeter to provide directionality to the dielectric plate.

The dielectric window also has an inner surface 108 and an outer surface (not visible). The inner surface 108 of the dielectric window is oriented towards the wafer, or in other words towards the plasma. The thickness of the dielectric window is measured between the inner surface and the outer surface, and may vary or may be constant for purposes of the present disclosure.

The dielectric window 100 is made from a dielectric material. For example, the dielectric window may be made from a ceramic, such as aluminum oxide ($Al_2O_3$) or silicon dioxide ($SiO_2$). As another example, the dielectric window can be made from anodized aluminum, which is aluminum that has been treated to form a surface layer of $Al_2O_3$. In particular embodiments of the present disclosure, the dielectric window is made of $Al_2O_3$.

Continuing, a protective coating 120 is applied to the inner surface 108 of the dielectric window. The protective coating, in some particular embodiments, comprises yttrium. For example, the protective coating can be made from yttrium oxide ($Y_2O_3$), yttrium trifluoride ($YF_3$), yttrium oxyfluoride (YOF), or yittrium aluminum garnet (YAG). The protective coating also has an inner perimeter 124 proximate the central hole, and has an outer perimeter 126 proximate the outer perimeter 106 of the window. It is noted that when installed in a plasma treatment tool, an o-ring is typically located along the outer perimeter 106 of the window for sealing the chamber. Thus, the protective coating usually does not need to extend to the outer perimeter 106.

FIGS. 2A-2D illustrate a method for preparing a void-free coating on the dielectric window, according to some embodiments of the present disclosure. These figures are illustrated as side cross-sections, and are not to scale.

Figure 2A:
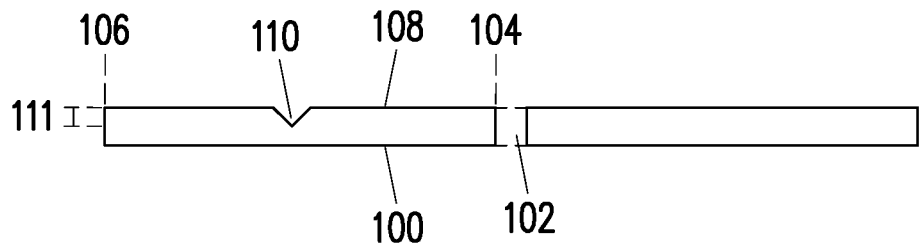
FIGS. 2A-2D are side cross-sectional views illustrating a method for preparing a void-free coating on the dielectric window, in accordance with some embodiments.

FIG. 2A shows the dielectric window 100 by itself. The inner perimeter 104 is in the center of the figure near the hole 102, with the outer perimeter 106 being marked on the left-hand side of the figure. Also illustrated is a void 110 extending into the dielectric window from the inner surface 108. The void 110 may have a depth 111 of up to 10 micrometers ($\mu m$). It is noted in this regard that the dielectric window itself is typically polished to obtain as flat a surface as possible prior to application of any coating, so the depth of any voids is typically controlled.

Figure 2B:
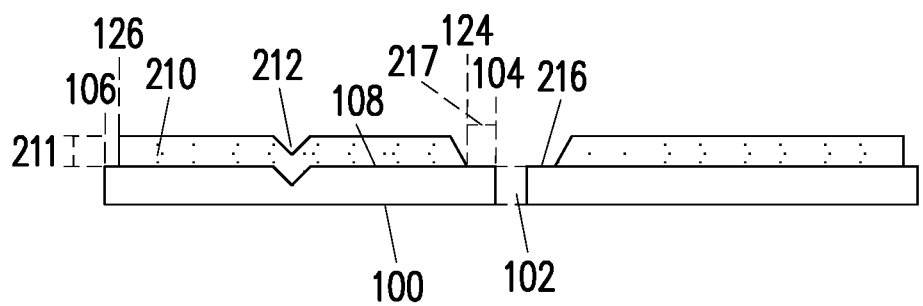

In FIG. 2B, a first protective coating layer 210 is applied to the inner surface 108 of the dielectric window. In particular embodiments, the first protective coating layer has a thickness 211 of about 5 micrometers ($\mu m$) to about 30 $\mu m$. This thickness is sufficient to fill any voids that may be present in the inner surface of the dielectric window, without making the first protective coating layer excessively thick in light of further processing steps. As indicated here, however, the first protective coating layer itself may contain voids 212 that correspond to the locations of voids in the inner surface.

The first protective coating layer 210 is applied so as to leave an uncoated area 216 around the central hole 102. This uncoated area has an annular shape when viewed from the top, and is referred to herein as a retreat area. The retreat area has a width 217, as measured between the window inner perimeter 104 and the coating inner perimeter 124. The width 217 of the retreat area is greater than zero (0), and may be as high as about 2000 micrometers ($\mu m$). In some particular embodiments, the width of the retreat area is from about 200 $\mu m$ to about 2000 $\mu m$, or from about 300 $\mu m$ to about 600 $\mu m$. If the retreat area has a width of greater than about 2000 $\mu m$, the final protective coating may be easier to damage.

As previously mentioned, the first protective coating layer outer perimeter 126 is also offset from the window outer perimeter 106.

Figure 2C:
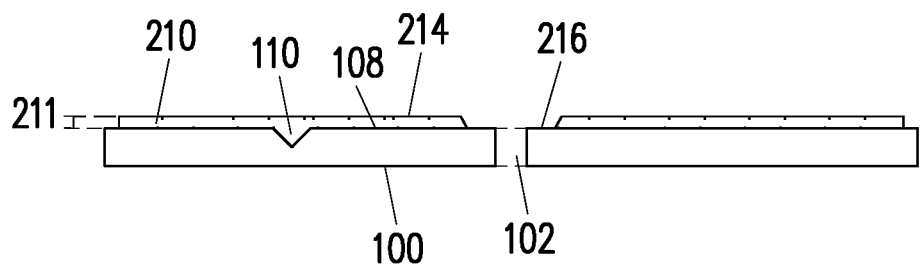

In FIG. 2C, the first protective coating layer 210 is polished to produce a flat surface 214. Of note, the void 110 in the inner surface 108 is filled in, while the void 212 that was present in the first protective coating layer in FIG. 2B has been removed by the polishing. The thickness 211 of the first protective coating layer after polishing is now reduced compared to its thickness in FIG. 2B, prior to the polishing step. For example, the thickness of the first protective layer may be from about 2.5 $\mu m$ to about 30 $\mu m$.

Figure 2D:
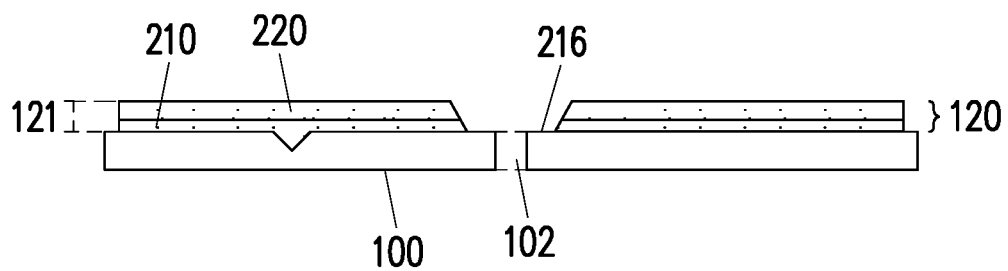

Finally, in FIG. 2D, a second protective coating layer 220 is applied onto the first protective coating layer 210, to produce the protective coating 120. The resulting dielectric window 100 thus has a protective coating with an uncoated annular retreat area 216 (i.e. not coated with the protective coating). It is noted that the final protective coating is free of voids.

The final protective coating has a thickness 121 of about 100 $\mu m$ or less (but greater than zero). At higher thicknesses, the coating may be more easily damaged. The final protective coating is also smooth. In particular embodiments, the protective coating has a surface roughness (i.e. areal roughness, Sa) of about 0.5 micrometers or less. The surface roughness can be measured, for example, using while light interferometry (WLI) or using a scanning confocal microscope or other suitable instruments.

Figure 3:
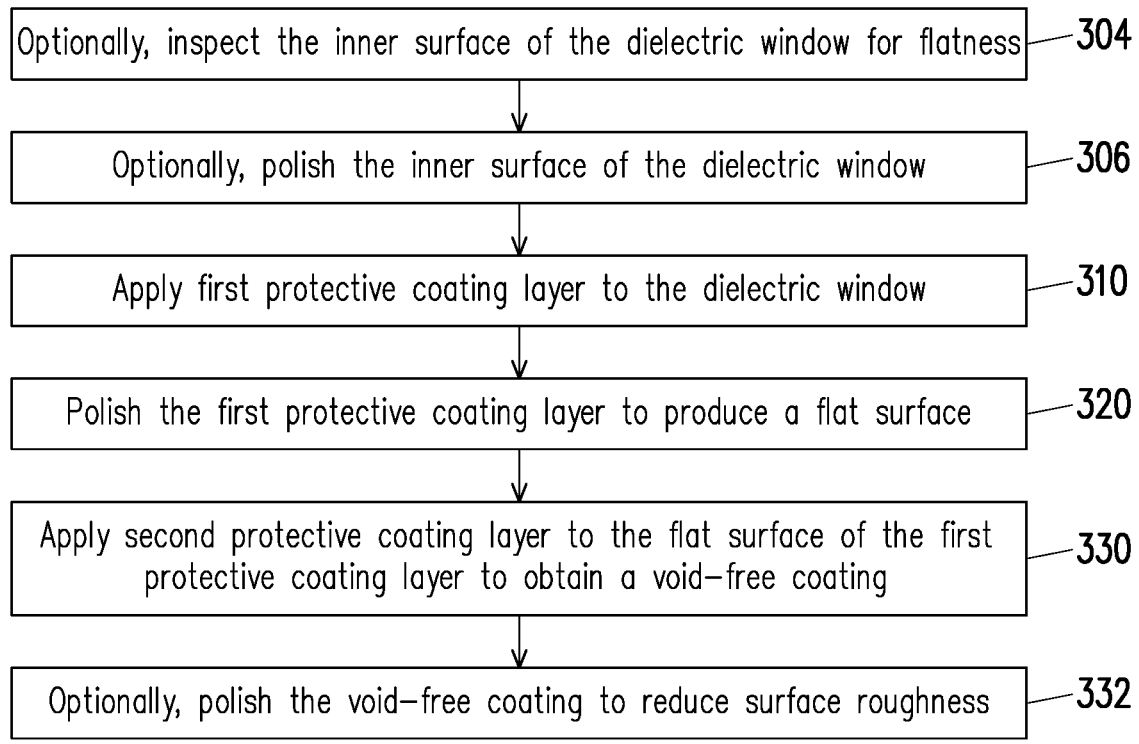
FIG. 3 is a flowchart illustrating a method for preparing a void-free coating on the dielectric window, in accordance with some embodiments.

FIG. 3 is a flowchart illustrating a method for preparing a void-free coating on the dielectric window, according to some embodiments of the present disclosure, and with reference to FIGS. 2A-2D.

Initially, prior to any coating steps, the inner surface of the dielectric window 100 is inspected for flatness, i.e. as flat a surface as possible, without any bumps or voids. If any bumps or voids are too large, the inner surface is polished to remove such bumps and voids. It is further contemplated that the methods of the present disclosure can also be applied to recycle used dielectric windows. It may also be desirable to polish the inner surface to remove any protective coatings that are present on the inner surface of such used dielectric windows. This is indicated as optional steps 304 and 306. After these steps, the dielectric window should be in the condition illustrated in FIG. 2A.

In step 310, a first protective coating layer is applied to the dielectric window, leaving an uncoated annular retreat area around the central hole. This step is illustrated in FIG. 2B.

Next, in step 320, the first protective layer is polished to produce a flat surface. This step is illustrated in FIG. 2C.

In step 330, a second protective coating layer is applied upon the flat surface of the first protective coating layer to obtain the void-free coating. This step is illustrated in FIG. 2D.

In optional step 332, if needed, the void-free coating is polished again to reduce the surface roughness.

In accordance with some embodiments of the present disclosure, the application of the first protective coating layer and the second protective coating can be performed using any deposition process, such as physical vapor deposition (PVD) or chemical vapor deposition (CVD). In particular, PVD and CVD can produce a coating with greater hardness and higher crystallinity compared to other processes such as aerosol deposition, where a solid powder is sprayed onto the substrate.

In PVD, the temperature of the substrate (i.e. the dielectric window) is much lower than the melting temperature of the material to be deposited. In one form of physical vapor deposition, the substrate (i.e. the dielectric window) is placed in a chamber at very low pressure. The material to be deposited to form the protective coating is converted into a vapor. This can be done, for example, by heating using resistance heating, a high-power electric arc, electron bombardment, or pulsed laser. The vapor is then deposited evenly upon the substrate.

In another form of physical vapor deposition known as sputtering, the substrate and a sputtering target are placed in a deposition chamber. The sputtering target includes the material to be deposited to form the protective coating. The sputtering target and the substrate are placed in proximity to one another within the chamber and the target is bombarded with positively charged ions such as ionized argon. The high energy ions cause atoms on the surface of the sputtering target to be ejected and deposited on the surface of the substrate.

As previously mentioned, the protective coating may comprise yttrium, with some examples including yttrium oxide ($Y_2O_3$), yttrium trifluoride ($YF_3$), yttrium oxyfluoride (YOF), or yittrium aluminum garnet (YAG). Elemental yttrium can be evaporated in the presence of oxygen to form a $Y_2O_3$ protective coating. A $Y_2O_3$ coating can be reacted with fluorine-containing plasma to obtain a YOF coating.

Chemical vapor deposition (CVD) is also typically performed at very low pressure. The substrate is exposed to one or more volatile precursors, which react or decompose on the substrate surface to produce the desired material (i.e. the protective coating). YAG, for example, can be produced using CVD processes.

In particular embodiments, the protective coating is applied to the dielectric window using PVD. PVD provides a higher density coating compared to other processes. In particular, the protective coating may have a higher hardness and a higher crystallinity, which can reduce surface damage to the coating and improve wafer quality (due to lower production of particulates). Thus, in some embodiments, the protective coating may have a Vickers hardness (Hv) of about 700 or greater. The Hv may be as high as about 1200. Similarly, in some embodiments, the protective coating may have a crystallinity of about 80% or greater.

Figure 4:
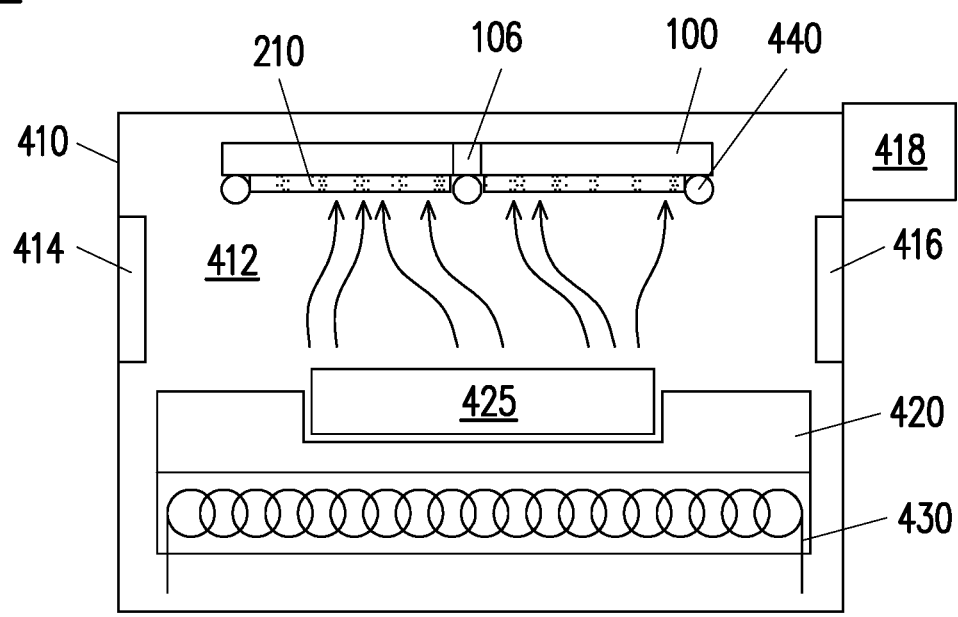
FIG. 4 is a side cross-sectional schematic diagram illustrating an example system for performing PVD or CVD that use the dielectric window, in accordance with some embodiments.

FIG. 4 is a side cross-sectional schematic diagram illustrating an example system for performing PVD or CVD, for depositing the protective coating layers. The PVD/CVD system 400 includes a housing 410 that defines a reaction chamber 412. Located within the chamber 412 is a sample holder 420, which contains the material to be deposited. For example, here, a block 425 of yttrium is present within the sample holder. A resistance heater 430 contacts the sample holder 420.

A substrate holder 440 is located above the sample holder 420, and the dielectric window 100 is illustrated as being held by the substrate holder. In some embodiments, the substrate holder 440 may be shaped to cover the retreat area around the central hole 106 of the dielectric window, and prevent any coating material from being deposited in the retreat area. Alternatively, the retreat area can be covered before placing the dielectric window into the substrate holder, for example by attaching a removable shield to the dielectric window.

The system also includes one or more gas inlets 414, through which process gases are introduced into the internal volume. The gas inlet(s) are connected to gas sources for providing the specified gas. One or more gas outlets 416 is also present for removing undesired gases, and for reducing the pressure within the housing. A gas outlet can be connected to a pump (not shown) for creating vacuum. A controller 418 is used to control the various inputs and outputs, and to measure various conditions within the system.

In operation, the chamber is held at very low pressure (i.e. close to vacuum). An appropriate gas (e.g. $O_2$) is provided via gas inlet 414. Heat applied to the block 425 by the heater 430 causes the yttrium to evaporate. A coating layer 210 of $Y_2O_3$ can thus be formed on the dielectric window 100.

Figure 5:
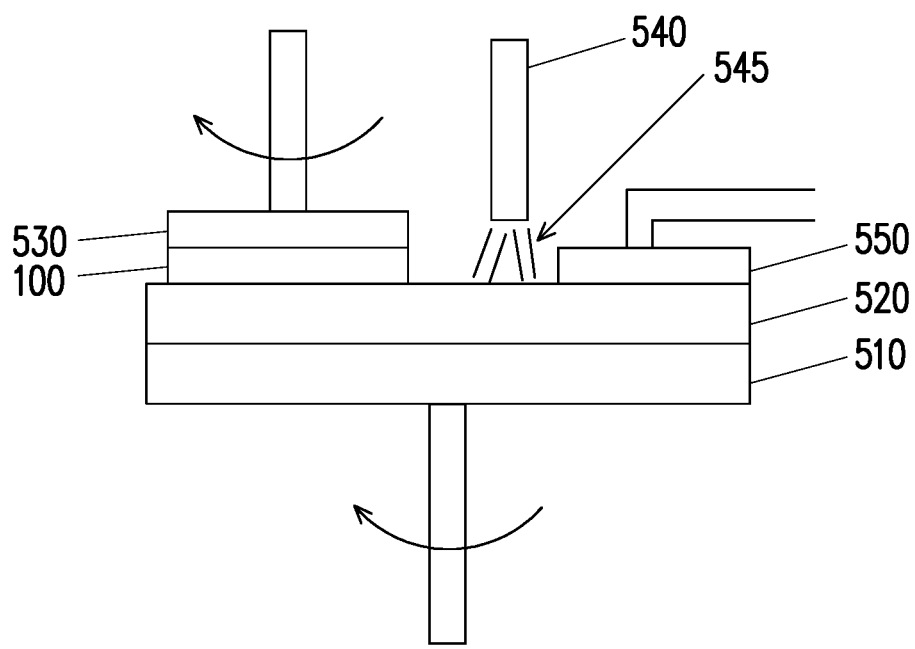
FIG. 5 is a side cross-sectional schematic diagram illustrating an example system for performing CMP, in accordance with some embodiments. CMP is used in some method steps of FIG. 3.

The polishing steps for making the void-free coating may be performed, for example, using chemical mechanical polishing (CMP) processes. FIG. 5 is a side cross-sectional schematic diagram illustrating an example system for performing CMP.

The CMP apparatus 500 includes a rotating platen 510 to which a polishing pad 520 is attached. The dielectric window 100 is attached to a carrier 530 suspended over the polishing pad. During polishing, both the polishing pad 520 and the carrier 530 rotate, with the carrier applying a downward force to cause the dielectric window and the polishing pad to come into contact with each other. A slurry dispenser 540 may deposit a slurry 545 onto the polishing pad 520. The slurry may contain various chemicals and abrasives for enhancing the polishing process. A pad conditioner 550 may be used to remove debris and excess slurry from the polishing pad 520 during CMP processing.

Figure 6:
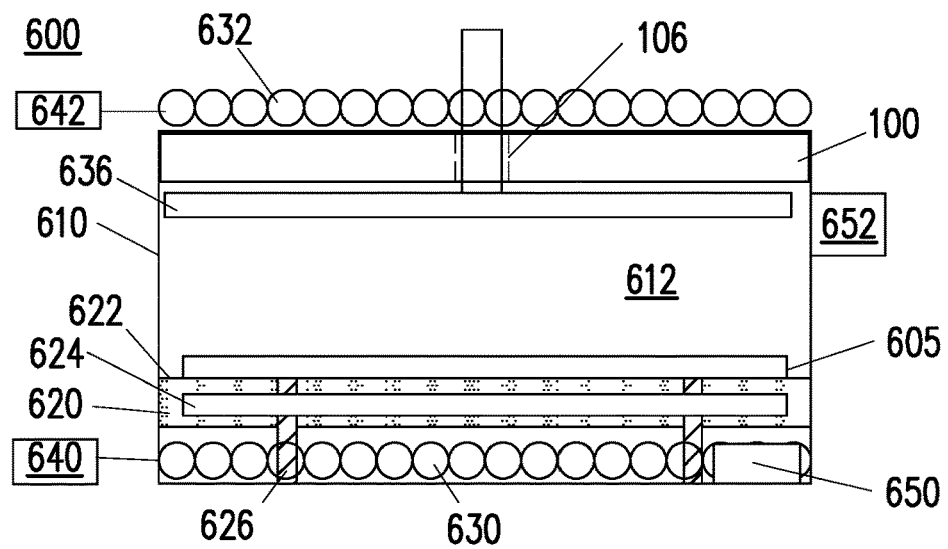
FIG. 6 is a side cross-sectional view illustrating a first embodiment of a plasma treatment tool of the present disclosure. This figure shows the various components of the plasma treatment tool, including the dielectric window.
Figure 7:
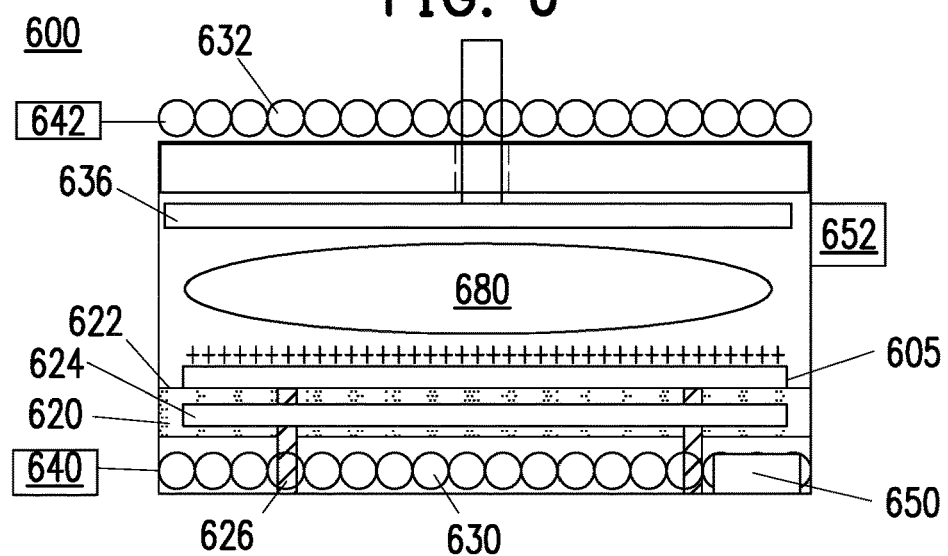
FIG. 7 is a side cross-sectional view showing the plasma treatment tool of FIG. 6 performing plasma treatment.
Figure 8:
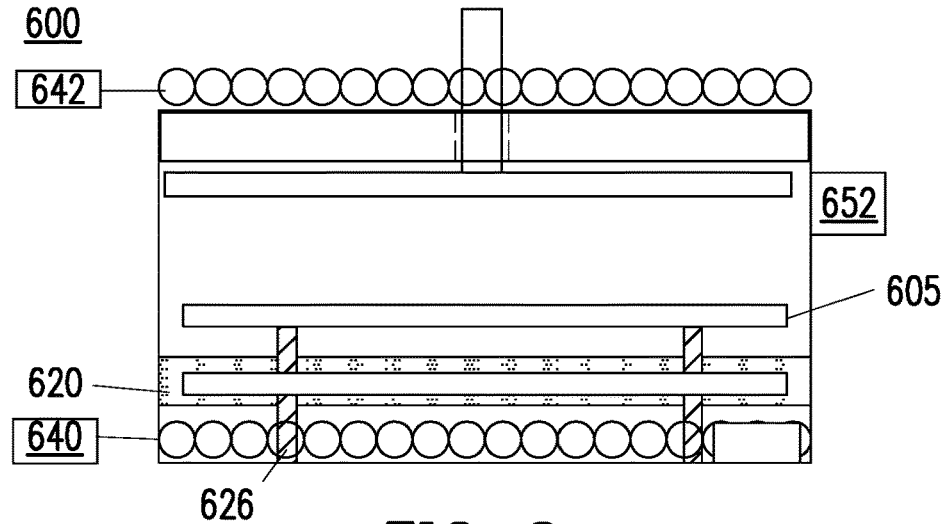
FIG. 8 is a side cross-sectional view showing the plasma treatment tool of FIG. 6 after plasma treatment, with loading pin cushions contacting the wafer substrate to dissipate residual charge.

The dielectric window having a void-free protective coating is used in a plasma treatment tool. FIGS. 6-8 are a set of side cross-sectional schematic diagrams illustrating one example plasma treatment system or tool 600 of the present disclosure in which the dielectric window of the present disclosure can be used, in accordance with some embodiments, as well as illustrating the use of the plasma treatment system.

Referring first to FIG. 6, the system includes a housing 610 with a reaction chamber 612. A wafer support pedestal 620 is present within the housing. The pedestal may be configured to hold a semiconductor wafer substrate 605 in a desired position. The pedestal 620 includes a support surface 622 which contacts the wafer substrate. The support surface itself is usually made of an electrically insulating material. The semiconducting wafer substrate is placed on the wafer support surface.

In particular embodiments, the pedestal is in the form of an electrostatic chuck that uses an electrostatic holding force to secure the wafer substrate. As illustrated here, the pedestal includes a chuck electrode 624 located below the support surface 622. Extending through the chuck electrode and the support surface are loading pins 626, which can be used to raise and lower the wafer substrate. In some embodiments, channels may be provided on the back side of the electrostatic chuck for providing gases or fluids to cool the wafer substrate during plasma treatment. In this way, warpage and/or other damage to the wafer substrate may be reduced or minimized.

Alternatively, the pedestal may apply vacuum pressure to hold the wafer substrate in place by suction. As yet another alternative, the pedestal may interact mechanically, for example using clamps or retaining rings or the like, to hold the wafer substrate in place using a mechanical holding force.

When used for production, the wafer substrate itself can be a wafer made of any semiconducting material. Such materials can include silicon, for example in the form of crystalline Si or polycrystalline Si. In alternative embodiments, the substrate can be made of other elementary semiconductors such as germanium, or may include a compound semiconductor such as silicon carbide (SiC), gallium arsenide (GaAs), indium arsenide (InAs), and indium phosphide (InP).

Continuing, a lower electrode 630 is located below the wafer substrate, and an upper electrode 632 is located above the wafer support pedestal 620. The dielectric window 100 is also located above the wafer support pedestal, with the protective coating oriented toward the wafer support surface 622 (i.e. facing the plasma). The dielectric window 100 is located between the wafer support pedestal 620 and the upper electrode 632, and physically separates the upper electrode from the interior of the reaction chamber 612. Similarly, the lower electrode 630 may also be isolated from the interior of the reaction chamber. The electrodes may be, for example, in the shape of a planar coil. The electrodes are used to provide energy for ionizing gas molecules so as to generate a plasma.

The system also includes a showerhead 636, through which process gases are introduced into the internal volume. The showerhead and/or gas lines for supplying the process gases pass through the central hole 106 of the dielectric window. The showerhead and/or gas lines are connected to gas sources for providing the specified gas. One or more gas outlets 650 is also present for removing undesired gases, and for reducing the pressure within the reaction chamber. A gas outlet can be connected to a pump (not shown) for creating vacuum. A door (not shown) is also present for accessing the reaction chamber, to insert and remove the wafer substrate.

At least one radiofrequency (RF) generator is present for applying RF power. Here, a lower RF generator 640 is coupled to the lower electrode 630, and an upper RF generator 642 is coupled to the upper electrode 632.

A controller 652 is used to control the various inputs and outputs, and to measure various conditions within the housing for the plasma treatment process. The system may also include sensors for monitoring applicable parameters. For example, such sensors may include those for tracking the flow rate of various gases, for measuring the content of gases exiting the chamber, for measuring the pressure within the chamber, the temperature of the wafer substrate, etc. The controller can also determine whether to activate or deactivate the system, how to vary the voltage to the electrodes, how to vary the gas mixture, and potentially also control the motion of any automated handling system that may be present, etc. It is noted that these various parameters may not have to be held steady during operation, and could be changed by the controller operating a computer program which alters their setpoints as appropriate. The controller may also include a user interface for communicating with operators.

The various components of the plasma treatment system may be made using materials and processes known in the art. For example, the various surfaces within the reaction chamber may include a protective coating.

In FIG. 7, plasma treatment is performed upon the wafer substrate 605. The plasma treatment can be performed, for example, as part of a dielectric barrier discharge (DBD) process, a reactive ion etching (RIE) process, or a sequential plasma (SPAB) process. Voltage provided by the RF generators 640, 642, is applied between the upper electrode 632 and the lower electrode 630 to ignite and sustain a plasma 680. The radiofrequency is usually operated at 13.56 megahertz (MHz), although other frequencies such as 2 MHz or 60 MHz may be used, depending on the application. The power used to generate the plasma may range from about 10 watts (W) to about 2,000 W. Once ignited, the plasma can be sustained by electric currents produced by electromagnetic induction associated with time-varying magnetic fields, or can become self-sustaining.

In some embodiments, the plasma treatment is performed in a vacuum environment, for example with the pressure within the housing being from about 0.1 pascals (Pa) to about 100 Pa. However, the pressure may be higher and could simply be sub-atmospheric, for example a pressure of about 10 kPa to about 95 kPa (for comparison, atmospheric pressure is about 101 kPa).

The process gas used for generating the plasma may include one or more gases that enter through the showerhead 636. Depending on the application, for example, the process gases may include nitrogen ($N_2$), hydrogen ($H_2$), argon (Ar), helium ($H_2$), fluorine ($F_2$), chlorine ($Cl_2$), oxygen ($O_2$), hydrogen bromide (HBr), hydrofluoric acid (HF), nitrogen trifluoride ($NF_3$), or sulfur hexafluoride ($SF_6$), or hydrofluorocarbons of the general formula $C_xH_yF_z$. Due to the plasma treatment, a residual voltage may remain on the wafer substrate, indicated here as a positive charge on the wafer substrate 605.

In FIG. 8, the loading pins 626 are raised to elevate the wafer substrate 605 above the pedestal 620. The loading pins now contact the bottom of the wafer substrate to dissipate any residual charge on the wafer substrate. Automated handling tools (not shown) can then grasp the wafer/semiconductor wafer substrate to a subsequent processing tool.

Figure 9:
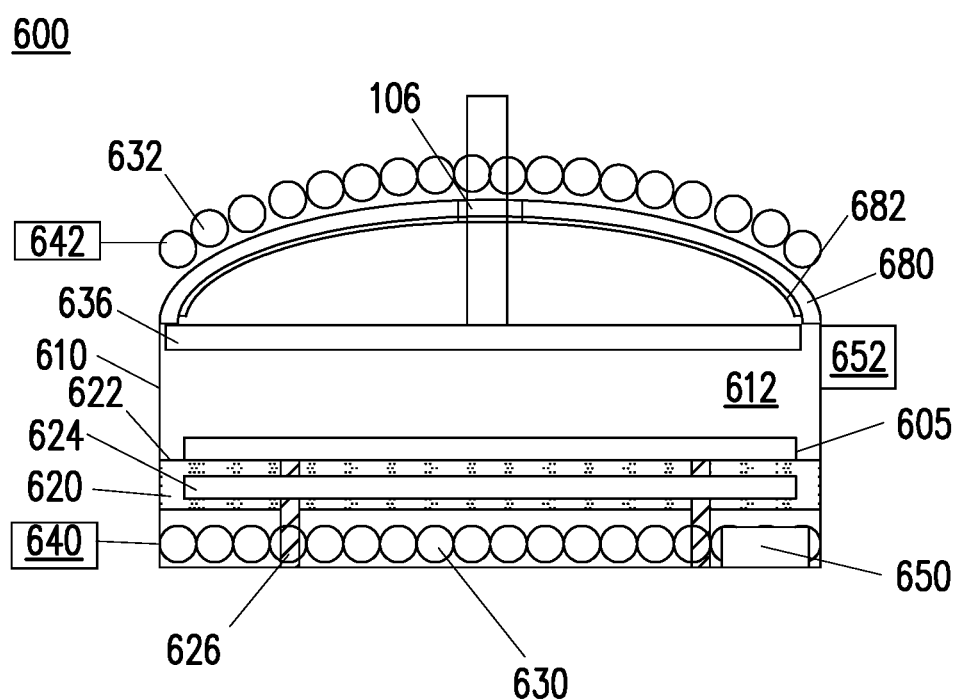
FIG. 9 is a perspective view of a second embodiment of a plasma treatment system, in accordance with some embodiments of the present disclosure. The dielectric window is in the form of a dome.

Another example of a plasma treatment system 600 is illustrated in the side cross-sectional schematic diagram of FIG. 9. In this embodiment, the dielectric window 680 is in the form of a dome rather than a plate or disk as in FIG. 1. A protective coating 682 is still present on the inner surface of the dome. The various method steps of FIG. 3 can be appropriately adapted to be performed on dielectric windows of various shapes. The shape of the upper electrode 632 is also appropriately adapted.

The plasma treatment tool can be used for performing dry etching. Dry etching can be used to form trenches and/or vias in a layer, and is a highly anisotropic process for obtaining high aspect ratios (i.e. predominantly vertical walls). For dry etching, for example, a patterned photoresist layer is present over a metal layer on the wafer substrate. The plasma treatment tool is then used to etch the exposed metal. Etch products may include for example, FCN, $CO_x$, $SiCl_x$, and/or $SiF_x$.

Figure 10A:
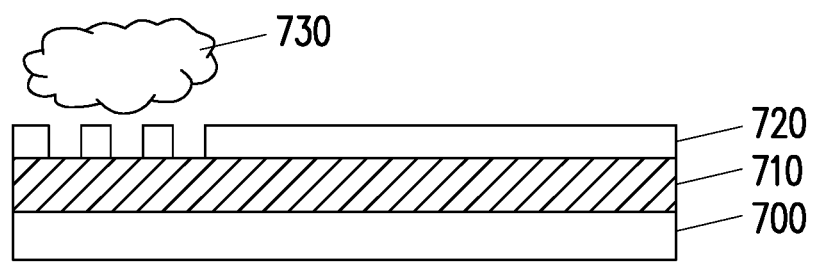
FIG. 10A and FIG. 10B are diagrams illustrating a dry etching process performed using a plasma treatment tool, in accordance with some embodiments.
Figure 10B:
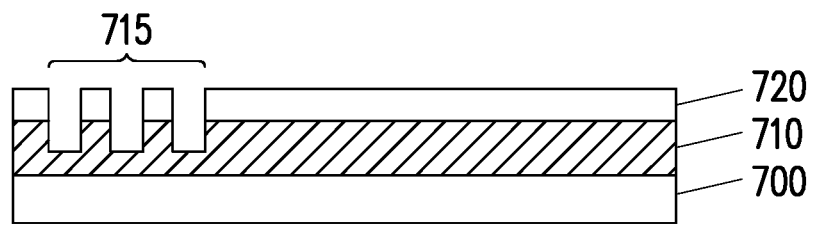

FIG. 10A and FIG. 10B are side cross-sectional views illustrating the dry etch process. In FIG. 10A, a metal layer 710 is present on a silicon substrate 700, and a photoresist layer 720 upon the metal layer has been patterned. The metal layer is then dry etched using plasma 730. Referring now to FIG. 10B, a trench 715 is present in the metal layer.

The plasma treatment tool can also be used for cleaning. The plasma treatment can remove contaminants from the surface of a wafer substrate. In addition, the surface is made hydrophilic by increasing the number of —OH groups on the surface, which may be beneficial for forming strong fusion bonds when wafer-to-wafer bonding is desired.

The methods of the present disclosure for producing a void-free protecting coating on the dielectric window have many advantages. First, the use of a retreat area around the central hole reduces stresses that are typically concentrated in places where the shape of the object changes sharply (i.e. the central hole). This reduces cracks and chips that can result in the protective coating, especially upon prolonged exposure to plasma. In this regard, the extrinsic stress on the protective coating (e.g. due to thermal mismatch between the coating and the dielectric window material) are proportional to the Young's modulus of the coating and inversely proportional to the Poisson's ratio of the coating. The intrinsic stress of the protective coating is proportional to the Young's modulus of the coating and the thickness of the dielectric window, and inversely proportional to the thickness of the protective coating, the Poisson's ratio of the coating, and the radius of bending. Thus, a coating material with a low Young's modulus and a high Poisson's ratio is desirable. Yttrium-based protective coating materials meet this requirement; for example, $Y_2O_3$ has a Young's modulus of about 170 GPa and a Poisson's ratio of about 0.31. In addition, a high radius of bending is desired to reduce intrinsic stress, and this can be obtained using the retreat area. Second, the lack of voids in the protective coating also reduces the formation of particulates from the coating itself. This combination of properties results in longer service lifetime for the plasma treatment tool. Wafer quality is also improved due to the lack of contaminants generated from the protective coating and the dielectric window.

Some embodiments of the present disclosure thus relate to methods for preparing a void-free coating on a dielectric window having a central hole for use in a plasma treatment tool. A first protective coating layer is applied to the window, leaving an uncoated annular retreat area around the central hole. The first protective coating layer is polished to produce a flat surface. A second protective coating layer is then applied upon the flat surface of the first protective coating layer to obtain the void-free coating.

Other embodiments of the present disclosure relate to a plasma treatment tool. The tool comprises a housing, an upper electrode, a dielectric window, and a wafer support surface. The dielectric window separates the upper electrode from the wafer support surface. The dielectric window includes a void-free protective coating oriented toward the wafer support surface and having an uncoated annular retreat area around a central hole therein. A lower electrode is located below the wafer support surface. One or more radiofrequency (RF) generators are present for applying an electromagnetic field within the housing.

Also disclosed in various embodiments are methods of plasma treating a semiconducting wafer substrate. The semiconducting wafer substrate is placed on a wafer support surface of a plasma treatment tool. The tool comprises a dielectric window located between the wafer support surface and an upper electrode. The dielectric window includes a void-free protective coating oriented toward the wafer support surface and has an uncoated annular retreat area around a central hole therein. The semiconducting wafer substrate is then plasma treated.

The methods and systems of the present disclosure are further illustrated in the following non-limiting working example, it being understood that the example is intended to be illustrative only and that the disclosure is not intended to be limited to the materials, conditions, process parameters and the like recited herein.

EXAMPLE

A dielectric window with a $Y_2O_3$ protective coating prepared by physical vapor deposition (PVD) was compared to a dielectric window with a $Y_2O_3$ protective coating prepared using aerosol deposition. The results are provided in the table below:

| Method | Aerosol Deposition | PVD |
|---|---|---|
| Thickness | ~10 μm | 10-20 μm |
| Surface roughness (Sa) | 0.03 μm | 0.02 μm |
| Hardness (Hv) | ~617 | ~1000 |
| Porosity | <0.1% | <0.1% |
| Crystallinity | 67.7% | 97.6% |

Figure 11:
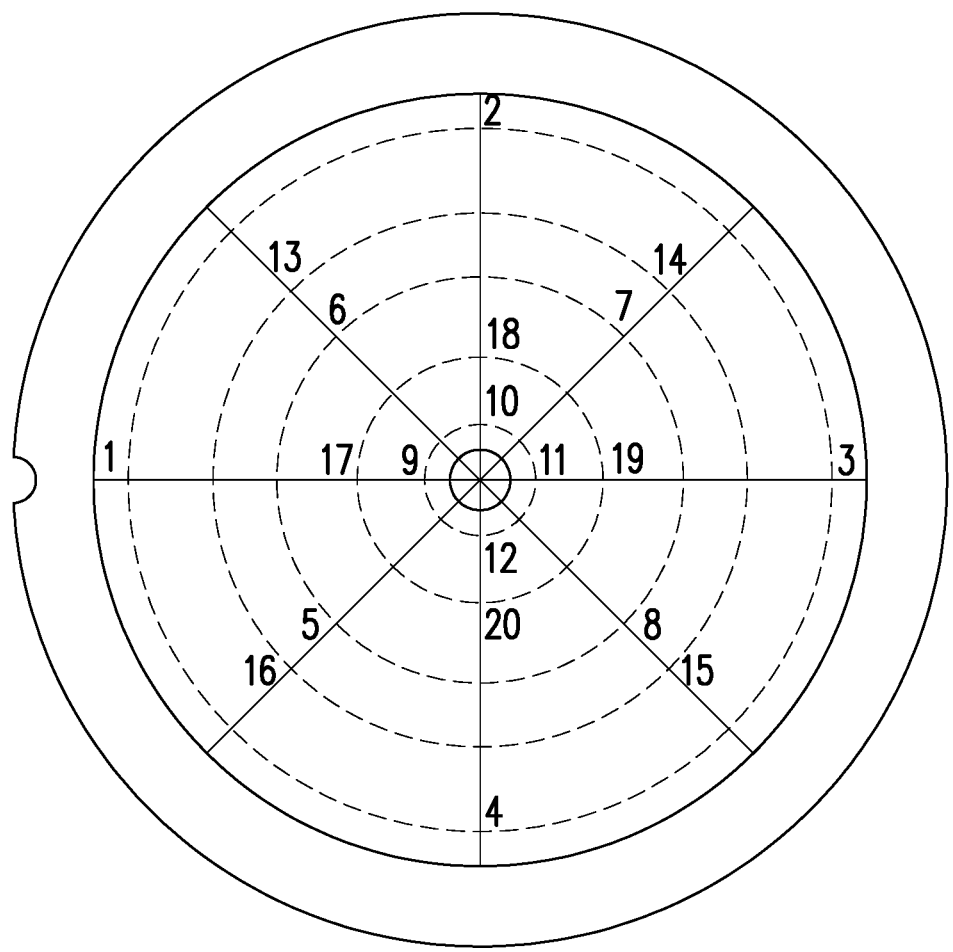
FIG. 11 is a diagram illustrating the locations where measurements were made on a circular dielectric window prepared according to the methods of the present disclosure.

Next, measurements of surface roughness and coating thickness were made in 20 different locations on the dielectric window prepared by PVD. FIG. 11 illustrates the locations. Briefly, locations 1-4 were located 20.5 cm away from the center, locations 5-8 were located 11 cm away from the center, locations 9-12 were located 1.5 cm away from the center, locations 13-16 were located 16 cm away from the center, and locations 17-20 were located 5.1 cm away from the center. The results are provided in the table below:

| Location | Surface roughness (μm) | Coating Thickness (μm) |
|---|---|---|
| 1 | 0.022 | 10 |
| 2 | 0.015 | 11 |
| 3 | 0.017 | 11 |
| 4 | 0.020 | 10 |
| 5 | 0.019 | 11 |
| 6 | 0.012 | 9 |
| 7 | 0.014 | 10 |
| 8 | 0.012 | 10 |
| 9 | 0.012 | 10 |
| 10 | 0.015 | 11 |
| 11 | 0.012 | 9 |
| 12 | 0.015 | 10 |
| 13 | 0.014 | 10 |
| 14 | 0.017 | 9 |
| 15 | 0.016 | 9 |
| 16 | 0.018 | 10 |
| 17 | 0.013 | 11 |
| 18 | 0.017 | 10 |
| 19 | 0.011 | 10 |
| 20 | 0.013 | 10 |

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for preparing a void-free coating on a dielectric window having a central hole for use in a plasma treatment tool, comprising:
applying a first protective coating layer to the dielectric window, the first protective coating layer having an inner perimeter and an outer perimeter, leaving an uncoated annular retreat area between the first protective coating layer inner perimeter and a window inner diameter at the central hole;
polishing the first protective coating layer to produce a flat surface; and
applying a second protective coating layer upon the flat surface of the first protective coating layer to obtain the void-free coating.

2. The method of claim 1, wherein the first protective coating layer and the second protective coating layer comprise yttrium.

3. A method for preparing a void-free coating on a dielectric window having a central hole for use in a plasma treatment tool, comprising:
applying a first protective coating layer to the dielectric window, leaving an uncoated annular retreat area between the first protective coating layer and the central hole;
polishing the first protective coating layer to produce a flat surface; and
applying a second protective coating layer upon the flat surface of the first protective coating layer to obtain the void-free coating.

4. The method of claim 3, wherein the dielectric window is made from a ceramic or anodized aluminum.

5. The method of claim 4, wherein the first protective coating layer and the second protective coating layer comprise $Y_2O_3$, YOF, or yttrium aluminum garnet (YAG).

6. The method of claim 3, wherein the first protective coating layer and the second protective coating layer comprise yttrium.

7. The method of claim 3, wherein the first protective coating layer and the second protective coating layer are applied using physical vapor deposition.

8. The method of claim 3, wherein the uncoated annular retreat area has a width of greater than 0 micrometers (μm) to about 2000 μm.

9. The method of claim 3, wherein the first protective coating layer has a thickness of about 5 μm to about 30 μm.

10. The method of claim 3, wherein the void-free coating has a thickness of about 100 μm or less.

11. The method of claim 3, wherein the void-free coating has a surface roughness of less than 0.5 μm.

12. The method of claim 3, wherein the void-free coating has a Vickers hardness (Hv) of about 700 or greater.

13. The method of claim 3, wherein the void-free coating has a crystallinity of about 80% or greater.

14. The method of claim 3, further comprising, prior to applying the first protective coating layer, inspecting the dielectric window for flatness: or
further comprising, prior to applying the first protective coating layer, polishing the dielectric window to remove any protective coatings already present.

15. The method of claim 3, wherein the dielectric window is a plate or a disk having a circular shape with the central hole therein.

16. The method of claim 3, wherein a notch is present along an outer perimeter of the dielectric window.

17. The method of claim 3, wherein the uncoated annular retreat area has a width of about 200 μm to about 2000 μm, or wherein the uncoated annular retreat area has a width of about 300 μm to about 600 μm.

18. The method of claim 3, wherein the first protective coating layer and the second protective coating layer are applied using chemical vapor deposition.

19. The method of claim 3, wherein the void-free coating has a Vickers hardness (Hv) of about 1200.

20. The method of claim 3, wherein the polishing is performed by chemical mechanical polishing (CMP).

* * * * *